(12) United States Patent
Binal et al.

(10) Patent No.: US 11,962,280 B2
(45) Date of Patent: Apr. 16, 2024

(54) SYNCHRONIZED CONTROLLER

(71) Applicant: Crestron Electronics, Inc., Rockleigh, NJ (US)

(72) Inventors: Ekin Binal, Brooklyn, NY (US); Rakeshkumar Patel, Emerson, NJ (US)

(73) Assignee: Crestron Electronics, Inc., Rockleigh, NJ (US)

(*) Notice: Subject to any disclaimer, the term of this patent is extended or adjusted under 35 U.S.C. 154(b) by 197 days.

(21) Appl. No.: 17/730,574

(22) Filed: Apr. 27, 2022

(65) Prior Publication Data
US 2023/0164489 A1    May 25, 2023

Related U.S. Application Data

(63) Continuation of application No. 17/685,894, filed on Mar. 3, 2022, now abandoned.
(Continued)

(51) Int. Cl.
*H03G 5/16* (2006.01)
*G06F 3/16* (2006.01)
(Continued)

(52) U.S. Cl.
CPC .............. *H03G 5/165* (2013.01); *G06F 3/162* (2013.01); *G06F 3/165* (2013.01); *G10L 15/26* (2013.01);
(Continued)

(58) Field of Classification Search
CPC ......... H04L 67/06; H04L 67/34; H04L 12/10; H04L 67/1097; H04R 5/04; H04R 1/00;
(Continued)

(56) References Cited

U.S. PATENT DOCUMENTS

2021/0218786 A1*  7/2021  Hernandez ............ H04L 67/306
2021/0249912 A1*  8/2021  Glover ................... H02J 50/40
(Continued)

*Primary Examiner* — Lun-See Lao
(74) *Attorney, Agent, or Firm* — Crestron Electronics, Inc.

(57) ABSTRACT

A system and method are described herein for configuring an audio distribution system, comprising a Redis server, the Redis server adapted to store Redis data to be used in configuring the audio distribution system; a plurality of audio devices, the plurality of audio devices and Redis server interconnected to form the audio distribution system, wherein each of the plurality of audio devices comprises—at least one processor; an electronic communications interface operatively connected to the at least one processor and adapted to receive data from a user and transfer the data to the at least one processor; and a memory operatively connected with the at least one processor, wherein the memory stores computer-executable instructions that, when executed by the at least one processor, causes the at least one processor in a first audio device to execute a method for configuring the audio distribution system that comprises: establishing communications using the electronic communications interface between the user and the at least one processor of the first audio device, such that data input by the user is received by the at least one processor of the first audio device; establishing communications to each of the remaining plurality of audio devices and Redis server in the audio distribution system; obtaining information from each of the remaining plurality of audio devices with which communications have been established, such information including one or more of an audio device name, part number, serial number, internet protocol address number, and physical location; receiving configuration information from the user that pertains to a specific audio device of the plurality of audio devices in the audio distribution system that, when installed on a specific audio device, causes the specific audio
(Continued)

device to operate in a known manner; and copying that configuration information to others of the same specific type of audio device in the audio distribution system.

14 Claims, 5 Drawing Sheets

Related U.S. Application Data

(60) Provisional application No. 63/282,320, filed on Nov. 23, 2021.

(51) Int. Cl.
| | |
|---|---|
| *G10L 15/26* | (2006.01) |
| *G10L 25/30* | (2013.01) |
| *G10L 25/87* | (2013.01) |
| *H03F 3/72* | (2006.01) |
| *H03K 5/1532* | (2006.01) |
| *H03M 1/00* | (2006.01) |
| *H03M 1/10* | (2006.01) |
| *H04L 12/10* | (2006.01) |
| *H04L 67/00* | (2022.01) |
| *H04L 67/06* | (2022.01) |
| *H04R 1/00* | (2006.01) |
| *H04R 3/04* | (2006.01) |
| *H04R 5/04* | (2006.01) |
| *H04R 29/00* | (2006.01) |
| *H04W 76/10* | (2018.01) |

(52) U.S. Cl.
CPC .............. *G10L 25/30* (2013.01); *G10L 25/87* (2013.01); *H03F 3/72* (2013.01); *H03K 5/1532* (2013.01); *H03M 1/1071* (2013.01); *H04L 12/10* (2013.01); *H04L 67/06* (2013.01); *H04L 67/34* (2013.01); *H04R 1/00* (2013.01); *H04R 3/04* (2013.01); *H04R 5/04* (2013.01); *H04R 29/001* (2013.01); *H04W 76/10* (2018.02); *H03M 1/001* (2013.01); *H04R 2430/01* (2013.01)

(58) Field of Classification Search
CPC .... H04R 2430/01; H04R 29/001; H04R 3/00; H04R 3/04; H04W 76/10; G10L 15/26; G10L 25/30; G10L 25/51; G10L 25/87; H03G 5/025; H03G 5/165; H03G 7/002; H03M 1/001; H03M 1/1071
USPC .................. 381/103–107, 56–58; 700/94
See application file for complete search history.

(56) References Cited

U.S. PATENT DOCUMENTS

| | | | |
|---|---|---|---|
| 2021/0289019 A1* | 9/2021 | Peng | H04L 67/55 |
| 2022/0266133 A1* | 8/2022 | Mawdesley | G07F 17/3225 |
| 2022/0337561 A1* | 10/2022 | Kulkarni | G06F 16/211 |

* cited by examiner

SYNCHRONIZED CONTROLLER

PRIORITY INFORMATION

The present application claims priority under 35 U.S.C. § 119(e) to U.S. Provisional Patent Application Ser. No. 63/282,320, filed Nov. 23, 2021, and the present application claims priority under 35 U.S.C. § 120 to U.S. Non-provisional patent application Ser. No. 17/685,894, filed Mar. 3, 2022, the entire contents of both which are expressly incorporated herein by reference.

BACKGROUND OF THE INVENTION

Technical Field

The embodiments described herein relate generally to audio systems, and more particularly to systems, methods, and modes for utilizing a software controller that can facilitate configuration of a plurality of audio devices in an audio distribution system and wherein such configuration includes substantially automating such configuration for existing audio devices and audio devices that will be installed in the future.

Background Art

Often, new customers of audio integration products will purchase multiple units of the same device. If the device is internet capable and feature rich, there can be many parameters to address when setting up the device, and this process needs to be repeated for each device. For example, Crestron manufactures an amplifier, the DM-NAX-8ZSA which has a web user interface (webUI) for setup, configuration, control, and monitoring of the device. It is typical for multiple units to be installed in a given system, and each unit has its own webUI. The problem is that the installer has to have a separate web page open to view all the units and constantly cycle between them when building a large system.

Accordingly, a need has arisen for systems, methods, and modes for an audio system to allow one of several similar devices to be a master device within which audio system variables for all the devices can be set up and distributed.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for an audio system to allow one of several similar devices to be a master device within which audio system variables for all the devices can be set up and distributed that will obviate or minimize problems of the type previously described.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, an audio distribution system is provided, comprising: a Redis server, the Redis server adapted to store Redis data to be used in configuring the audio distribution system; a plurality of audio devices, the plurality of audio devices and Redis server interconnected to form the audio distribution system, wherein each of the plurality of audio devices comprises—at least one processor; an electronic communications interface operatively connected to the at least one processor and adapted to receive data from a user and transfer the data to the at least one processor; and a memory operatively connected with the at least one processor, wherein the memory stores computer-executable instructions that, when executed by the at least one processor, causes the at least one processor in a first audio device to execute a method for configuring the audio distribution system that comprises: establishing communications using the electronic communications interface between the user and the at least one processor of the first audio device, such that data input by the user is received by the at least one processor of the first audio device; establishing communications to each of the remaining plurality of audio devices and Redis server in the audio distribution system; obtaining information from each of the remaining plurality of audio devices with which communications have been established, such information including one or more of an audio device name, part number, serial number, internet protocol address number, and physical location; receiving configuration information from the user that pertains to a specific audio device of the plurality of audio devices in the audio distribution system that, when installed on a specific audio device, causes the specific audio device to operate in a known manner; and copying that configuration information to others of the same specific type of audio device in the audio distribution system.

According to the first aspect of the embodiments, the method further comprises: receiving configuration information from the user that pertains to each of the remaining specific audio devices of the plurality of audio devices in the audio distribution system that, when installed on the specific audio device, causes that specific audio device to operate in a known manner; and copying the configuration file for the specific audio device to others of the same specific type of audio device in the audio distribution system.

According to the first aspect of the embodiments, the method further comprises: receiving configuration information from the user that pertains to one or more audio devices not presently interconnected to the audio distribution system and storing the currently unused configuration information; connecting the previously un-interconnected one or more audio devices to the audio distribution system; substantially automatically finding the now interconnected but previously un-interconnected audio devices and establishing communications therewith; obtaining information from each of the now interconnected but previously un-interconnected audio devices, such information including one or more of an audio device name, part number, serial number, internet protocol address number, and physical location; copying the currently unused configuration information to each of the now interconnected but previously un-interconnected audio devices, wherein audio devices that are of the same type receive the same configuration information.

According to the first aspect of the embodiments, the method further comprises: assigning the first audio device to be a virtual manager of the audio distribution system, wherein the virtual manager is adapted to perform all of the steps of the method for configuring the audio distribution system, and is further adapted to communicate from one or more users through one or more networks.

According to the first aspect of the embodiments, the one or more networks includes a local area network.

According to the first aspect of the embodiments, the one or more networks includes a Crestron audio network.

According to the first aspect of the embodiments, the one or more networks includes an internet.

According to a second aspect of the embodiments, a method for configurating an audio distribution system is provided, comprising: establishing communications using an electronic communications interface between a user and at least one processor located in a first audio device of a plurality of audio devices, wherein the plurality of audio devices and a Redis server are interconnected to form the audio distribution system, and wherein the Redis server is adapted to store Redis data to be used in configuring the audio distribution system, and wherein each of the plurality of audio devices comprises—at least one processor; the electronic communications interface operatively connected to the at least one processor and adapted to receive data from a user and transfer the data to the at least one processor; and a memory operatively connected with the at least one processor, wherein the memory stores computer-executable instructions that, when executed by the at least one processor, allows the at least one processor in a first audio device to execute the method for configuring the audio distribution system; establishing communications using the electronic communications interface between the user and the at least one processor of the first audio device, such that data input by the user is received by the at least one processor of the first audio device; establishing communications to each of the remaining plurality of audio devices and Redis server in the audio distribution system; obtaining information from each of the remaining plurality of audio devices with which communications have been established, such information including one or more of an audio device name, part number, serial number, internet protocol address number, and physical location; receiving configuration information from the user that pertains to a specific audio device of the plurality of audio devices in the audio distribution system that, when installed on a specific audio device, causes the specific audio device to operate in a known manner; and copying that configuration information to others of the same specific type of audio device in the audio distribution system.

According to the second aspect of the embodiments, the method further comprises: receiving configuration information from the user that pertains to each of the remaining specific audio devices of the plurality of audio devices in the audio distribution system that, when installed on the specific audio device, causes that specific audio device to operate in a known manner; and copying the configuration file for the specific audio device to others of the same specific type of audio device in the audio distribution system.

According to the second aspect of the embodiments, the method further comprises: receiving configuration information from the user that pertains to one or more audio devices not presently interconnected to the audio distribution system and storing the currently unused configuration information; connecting the previously un-interconnected one or more audio devices to the audio distribution system; substantially automatically finding the now interconnected but previously un-interconnected audio devices and establishing communications therewith; obtaining information from each of the now interconnected but previously un-interconnected audio devices, such information including one or more of an audio device name, part number, serial number, internet protocol address number, and physical location; copying the currently unused configuration information to each of the now interconnected but previously un-interconnected audio devices, wherein audio devices that are of the same type receive the same configuration information.

According to the second aspect of the embodiments, the method further comprises: assigning the first audio device to be a virtual manager of the audio distribution system, wherein the virtual manager is adapted to perform all of the steps of the method for configuring the audio distribution system, and is further adapted to communicate from one or more users through one or more networks.

According to the second aspect of the embodiments, the one or more networks includes a local area network.

According to the second aspect of the embodiments, the one or more networks includes a Crestron audio network.

According to the second aspect of the embodiments, the one or more networks includes an internet.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

DETAILED DESCRIPTION

Figure 1:
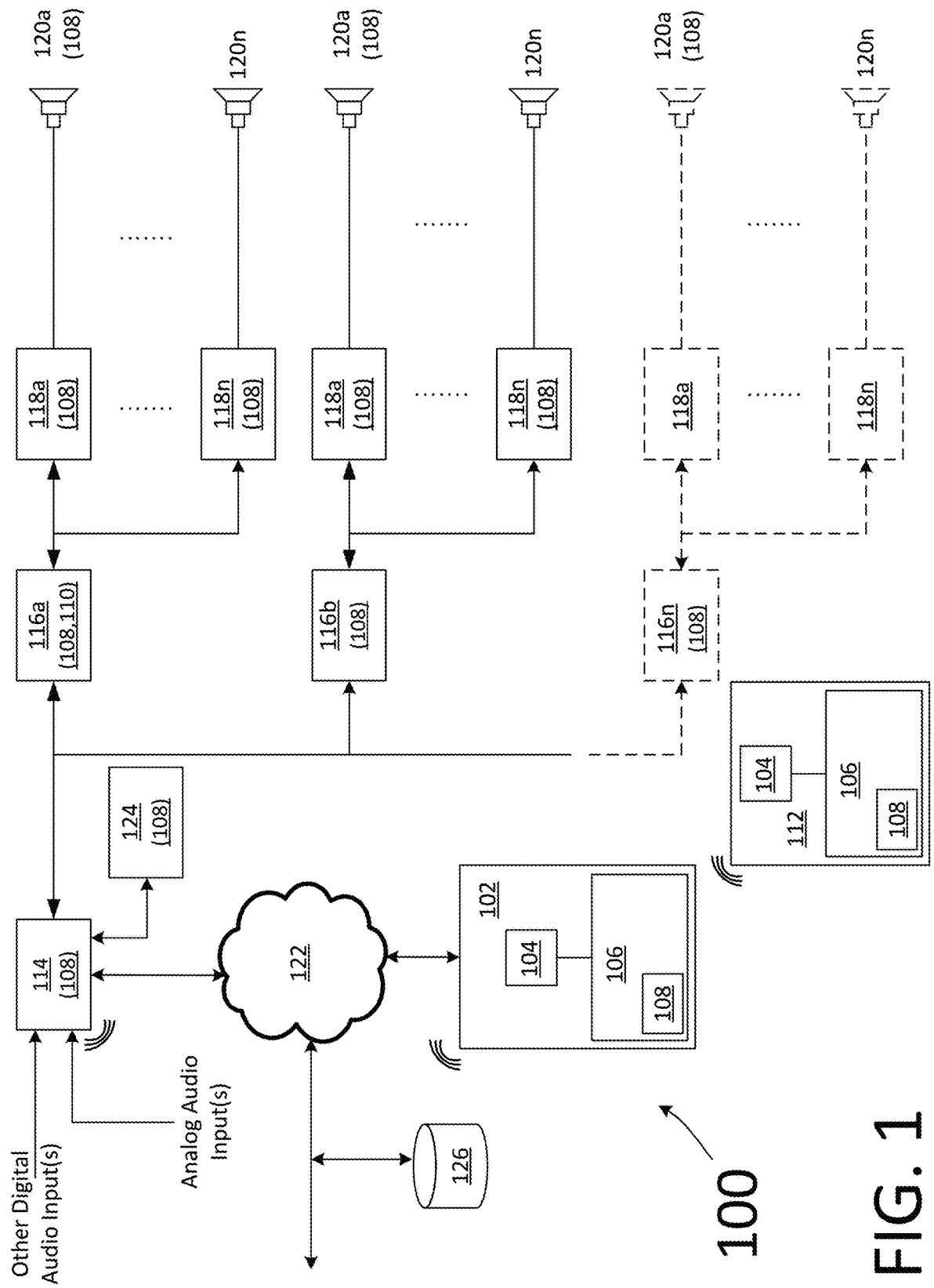
FIG. 1 illustrates a block diagram of an audio distribution system that can implement a virtual manager software application to configure and control a plurality of electronic audio distribution devices according to aspects of the embodiments.

The embodiments are described more fully hereinafter with reference to the accompanying drawings, in which embodiments of the inventive concept are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio amplifiers, but can be used in virtually any type of power supply.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" or "in an embodiment" in various places throughout the specification is not necessarily referring to the same embodiment. Further, the particular feature, structures, or characteristics may be combined in any suitable manner in one or more embodiments.

The different aspects of the embodiments described herein pertain to the context of a systems, methods, and modes for an audio system to allow one of several similar devices to be a master device within which audio system variables for all the devices can be set up and distributed, but is not limited thereto, except as may be set forth expressly in the appended claims.

The following is a list of elements shown in the Figures, in numerical order.
- 100 Audio Distribution System (ADS)
- 102 Personal Computer (PC)/Server (Server)
- 104 Microprocessor
- 106 Memory
- 108 Virtual Manager (VM) Software Application (VM App)
- 110 Operational Software Modules (Oper. SWM)
- 112 Mobile Electronic Device (MED)
- 114 Audio Transceiver
- 116 Digital Signal Processor (DSP)
- 118 Amplifier
- 120 Loudspeaker (Passive, Active)
- 122 Network
- 124 Tuner
- 126 Redis Client Server (p/o Redis)
- 202 Cluster Manager (CM) Software Module (SWM)
- 204 Authentication Manager (AM) SWM
- 206a Cluster Database (p/o Redis)
- 206b Local Database (p/o Redis)
- 208 Discovery SWM
- 210 Cresstore Handler SWM
- 212 Local Authentication Handler SWM
- 214 NAX SWM
- 216 Streaming Manager
- 218 Cresstore SWM
- 220 Crestron Protocol Handler
- 222 Web Server
- 224 Web User Interface (UI) SWM
- 300 Method for Configuring an Audio Distribution System
- 302-312 Method Steps of Method 300
- 402 Processor(s)
- 404 Processor Internal Memory
- 406 Operating System
- 408 Internal Data/Command Bus (Bus)
- 412 Read-Only Memory (ROM)
- 414 Random Access Memory (RAM)
- 416 Printed Circuit Board (PCB)
- 418 Hard Disk Drive (HDD)
- 420 Universal Serial Bus (USB) Port
- 422 Ethernet Port
- 424 Video Graphics Array (VGA) Port or High Definition Multimedia Interface (HDMI)
- 426 Compact Disk (CD)/Digital Video Disk (DVD) Read/Write (RW)
- (CD/DVD/RW)Drive
- 428 Floppy Diskette Drive
- 430 Integrated Display/Touch-Screen (Laptop/Tablet etc.)
- 432 Wi-Fi Transceiver
- 434 BlueTooth (BT) Transceiver
- 436 Near Field Communications (NFC) Transceiver
- 438 Third Generation (3G), Fourth Generation (4G), Fifth Generation (5G), Long Term
- Evolution (LTE) (3G/4G/5G/LTE) Transceiver
- 440 Communications Satellite/Global Positioning System (Satellite) Transceiver
- 442 Mouse
- 444 Scanner/Printer/Fax Machine
- 446 Universal Serial Bus (USB) Cable
- 448 High Definition Multi-Media Interface (HDMI) Cable
- 450 Ethernet Cable (CATS)
- 452 External Memory Storage Device
- 454 Flash Drive Memory
- 456 CD/DVD Diskettes
- 458 Floppy Diskettes
- 460 Keyboard
- 462 External Display/Touch-Screen
- 464 Antenna
- 466 Shell/Box
- 490 Computer
- 502 Modulator/Demodulator (Modem)
- 504 Wireless Router
- 506 Internet Service Provider (ISP)
- 508 Server/Switch/Router
- 510 Internet
- 512 Cellular Service Provider
- 514 Cellular Telecommunications Service Tower (Cell Tower)
- 516 Satellite Control Station
- 518 GPS Station
- 520 Satellite (Communications/Global Positioning System (GPS))
- 522 Mobile Electronic Device (MED)/Personal Electronic Device (PED)
- 524 Plain Old Telephone Service (POTS) Provider The following is a list of acronyms used herein, in alpha-numerical order.
- 3G Third Generation
- 4G Fourth Generation
- 5G Fifth Generation
- 6G Sixth Generation
- API Application Programming Interface
- App Executable Software Programming Code/Application
- ASIC Application Specific Integrated Circuit
- BIOS Basic Input/Output System
- BT BlueTooth
- CD Compact Disk CRT Cathode Ray Tube
DVD Digital Video Disk
EEPROM Electrically Erasable Programmable Read Only Memory
FPGA Field Programmable Gate Array
GAN Global Area Network
GPS Global Positioning System
GUI Graphical User Interface
GV Gravity Vector
HDD Hard Disk Drive
HDMI High Definition Multimedia Interface
ISP Internet Service Provider
LCD Liquid Crystal Display
LED Light Emitting Diode Display
LTE Long Term Evolution
MODEM Modulator-Demodulator
NFC Near Field Communications
OS Operating System
PC Personal Computer
PDF Portable Document Form
PED Personal Electronic Device
POTS Plain Old Telephone Service
PROM Programmable Read Only Memory
RAM Random Access Memory
ROM Read-Only Memory
RW Read/Write
USB Universal Serial Bus (USB) Port
UV Ultraviolet Light
UVPROM Ultraviolet Light Erasable Programmable Read Only Memory
VGA Video Graphics Array For 50 years Crestron Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes described herein can improve audio systems as discussed below.

In the following detailed description, references are made to the accompanying drawings that form a part hereof, and in which are shown by way of illustrations, specific embodiments, or examples. These aspects may be combined, other aspects may be utilized, and structural changes may be made without departing from the spirit or scope of the present disclosure. The following detailed description is therefore not to be taken in a limiting sense, and the scope of the present invention is defined by the appended claims and their equivalents.

While some embodiments will be described in the general context of program modules that execute in conjunction with an application program that runs on an operating system on a personal computer, those skilled in the art will recognize that aspects may also be implemented in combination with other program modules.

Generally, program modules include routines, programs, components, data structures, and other types of structures that perform particular tasks or implement particular abstract data types. Moreover, those of skill in the art can appreciate that different aspects of the embodiments can be practiced with other computer system configurations, including handheld devices, multiprocessor systems, microprocessor-based or programmable consumer electronics, minicomputers, mainframe computers, and comparable computing devices. Aspects of the embodiments can also be practiced in distributed computing environments where tasks are performed by remote processing devices that are linked through a communications network. In a distributed computing environment, program modules can be located in both local and remote memory storage devices.

Aspects of the embodiments can be implemented as a computer-implemented process (method), a computing system, or as an article of manufacture, such as a computer program product or computer readable media. The computer program product can be a computer storage medium readable by a computer system and encoding a computer program that comprises instructions for causing a computer or computing system to perform example process(es). The computer-readable storage medium is a computer-readable memory device. The computer-readable storage medium can for example be implemented via one or more of a volatile computer memory, a non-volatile memory, a hard drive, a flash drive, a floppy disk, or a compact disk, and comparable hardware media.

Throughout this specification, the term "platform" can be a combination of software and hardware components for providing share permissions and organization of content in an application with multiple levels of organizational hierarchy. Examples of platforms include, but are not limited to, a hosted service executed over a plurality of servers, an application executed on a single computing device, and comparable systems. The term "server" generally refers to a computing device executing one or more software programs typically in a networked environment. More detail on these technologies and example operations is provided below.

A computing device, as used herein, refers to a device comprising at least a memory and one or more processors that includes a server, a desktop computer, a laptop computer, a tablet computer, a smart phone, a vehicle mount computer, or a wearable computer. A memory can be a removable or non-removable component of a computing device configured to store one or more instructions to be executed by one or more processors. A processor can be a component of a computing device coupled to a memory and configured to execute programs in conjunction with instructions stored by the memory. Actions or operations described herein may be executed on a single processor, on multiple processors (in a single machine or distributed over multiple machines), or on one or more cores of a multi-core processor. An operating system is a system configured to manage hardware and software components of a computing device that provides common services and applications. An integrated module is a component of an application or service that is integrated within the application or service such that the application or service is configured to execute the component. A computer-readable memory device is a physical computer-readable storage medium implemented via one or more of a volatile computer memory, a non-volatile memory, a hard drive, a flash drive, a floppy disk, or a compact disk, and comparable hardware media that includes instructions thereon to automatically save content to a location. A user experience can be embodied as a visual display associated with an application or service through which a user interacts with the application or service. A user action refers to an interaction between a user and a user experience of an application or a user experience provided by a service that includes one of touch input, gesture input, voice command, eye tracking, gyroscopic input, pen input, mouse input, and keyboards input. An application programming interface (API) can be a set of routines, protocols, and tools for an application or service that allow the application or service to interact or communicate with one or more other applications and services managed by separate entities.

While example implementations are described using notebook applications herein, embodiments are not limited to a notebook application. As discussed previously, different types of content (in form of documents or other structured data) can be integrated within one type of application (for example, a spreadsheet application including word processing documents, presentation documents, and other content inserted within a spreadsheet), or a separate application can combine content from a variety of applications. Different types of content can include, but are not limited to, word processing documents, spreadsheets, notes, emails, other forms of communication recordings, presentations, graphics, images, audio data, video data, and comparable ones. Furthermore, an organizational structure of an application according to embodiments are not limited to the examples discussed herein. Content can be structured in different forms of hierarchical structures within the containers used by the application.

Technical advantages exist for utilizing a software controller to configure and control an audio distribution system utilizing the aspects of the embodiments that include being able to configure multiple devices of the same type at the same time without repeating the configuration process, as well as configuring devices that have not yet been installed but will be, and substantially automatically configure such device once it is installed.

Aspects of the embodiments address a need that arises from very large scale of operations created by networked computing and cloud-based services that cannot be managed by humans. The actions/operations described herein are not a mere use of a computer, but address results of a system that is a direct consequence of software used as a service such as communication services offered in conjunction with communications.

While some embodiments will be described in the general context of program modules that execute in conjunction with an application program that runs on an operating system on a personal computer, those skilled in the art will recognize that aspects may also be implemented in combination with other program modules.

FIGS. 1-5 illustrate various aspects of an audio device configuration program or application for use on one or more computing devices, including, according to certain aspects of the embodiments, use of the internet or other similar networks. The audio device configuration program provides a practical, technical solution to the problem of configuring multiple devices of the same type in as little time as possible; as those of skill in the art can appreciate, the aspects of the embodiments has no "analog equivalent" as its embodiments reside solely or substantially in the physical device or computer domain. That is, configuring devices in a digital audio system, always meant, and continues to mean, using practical, non-abstract physical devices. The technological improvement of the aspects of the embodiments resides in at least in the ability to configure many audio devices of the same type quickly and easily, and further to configure devices at a present time for future installation; there is no analog equivalent to such advantages, and none of these advantages could be accomplished without a computer or some other technological equivalent.

As discussed above, when there are multiple installations of the same device and each installation requires extensive set up, a significant amount of time can be expended to make the audio distribution system operational. According to aspects of the embodiments, a software application has been developed, "Virtual Manager," which provides at least the following benefits:

a. Centralized Configuration and Control for Zones, Input sources, Routing and Bussing;
    b. Offline configuration;
    c. High Availability.

The virtual manager App allows a user to configure and control a plurality of the same or different audio devices from a single device. According to aspects of the embodiments, the configuration is replicated to all device to provide high availability. According to further aspects of the embodiments, not all of the devices need to be configured at the same time—that is, a first sub-group can be simultaneously configured when on-line, and as others, or as another group comes online, those can be configured just as readily. If the virtual manager App goes down (in the device designated "virtual manager device), a new virtual manager device would be selected.

According to aspects of the embodiments, the virtual manager Ap runs in real-time, is dynamic, and runs directly on a web page.

According to further aspects of the embodiments, the virtual manager App can be implemented in many different types of audio distribution products, including, but not limited to the DM-NAX-8ZSA and the DM-NAX-16AIN. The Crestron® DM-NAX-8ZSA is a next generation Audio-over-IP (AoIP) amplifier that puts Crestron® multiroom audio distribution on the network. Streaming services are built-in with media player access available for each stereo amplified zone. There are 8 zones in the DM-NAX-8ZSA. The Crestron® DM-NAX-16AIN is a next generation Audio-over-IP (AoIP) input device, putting local sources on the Crestron® multiroom distributed audio network, and has 16 stereo inputs.

According to aspects of the embodiments, the virtual manager App defines one webUl to be the leader and enables that same webUl to manage all units in the system.

Aspects of the embodiments, therefore, overcome the need for custom software that needs to be installed and potentially licensed, and does not require compiling before it can be implemented, as in other currently available products.

FIG. 1 illustrates a block diagram of audio distribution system (ADS) 100 that can implement a virtual manager software application 108 to configure and control a plurality of electronic audio distribution devices according to aspects of the embodiments.

ADS 100 comprises several typical audio devices, a detailed description of which has been omitted herein in fulfillment of the dual purposes of clarity and brevity. ADS 100 comprises audio transceiver 114, tuner 124, digital signal processor (DSP) 116, amplifiers 118, and loudspeakers 120. Loudspeaker 120 can include both active (with an amplifier, and therefore power and perhaps other circuitry), and passive loudspeakers. For the purposes of this discussion, and as shown in FIG. 1, loudspeakers 120a are considered to be active, and therefore contain circuitry (included at least one processor and associated memory) that can store virtual manager software application (VM App) 108. VM App 108 contains a number of operational software modules which are described below in greater detail.

Also shown in FIG. 1 as part of ADS 100 are personal computer/server (server) 102, mobile electronic device (MED) 112, and network 122. Either or both of server 102 and MED 112 can access ADS through network 122 (or another network, such as a local area network (LAN), discussed and described in greater detail below), or via a direct wired or wireless interface. In FIG. 1, only server 102 is shown connected to network 122, but this need not necessarily be the case; as those of skill in the art can appreciate, MED 112 can also access internet 102 (or another type of network) through wired or wireless means, such as a WiFi interface, among other types of communications interfaces.

ADS 100 can receive analog or digital audio through one of several interface means; for example, a user of ADS 100 can subscribe to one or more internet based music subscription services such as Pandora®, Spotify®, iTunes®, and the like, and through network 122 ADS can obtain digital audio. Alternatively, ADS 100 can obtain digital music via digital audio devices such as compact disk player, tuners, and the like. Analog audio inputs can include a turntable, or the output of tuner 124; however, the output of tuner 124 can also be digitized prior to being output (therefore, the interface between transceiver 114 and tuner 124 can be digital or analog).

Once the audio has been received by transceiver 114, it can be forwarded to DSPs 116a-n, wherein very little or no digital signal processing can occur, or the digital audio signal can be significantly digitally processed prior to being output to amplifiers 118a-n. The output of amplifiers 118a-n are connected to one or more active and/or passive loudspeakers 120.

Also shown in FIG. 1 is Redis Client Server (Redis server) 126. The use of Redis server 126 is described in greater detail below.

According to aspects of the embodiments, any of the devices that comprises ADS 100 (114, 116, 118, 120, 124, and 126) can include VM app 108. In this manner, a user that uses either or both of server 102 and MED 104 can access VM App 108 in any device of ADS 100. In fulfillment of the dual purposes of clarity and brevity, however, the discussion below will consider that a user accesses ADS 100 via network 122, and first interfaces with transceiver 114 according to aspects of the embodiments.

Figure 2:
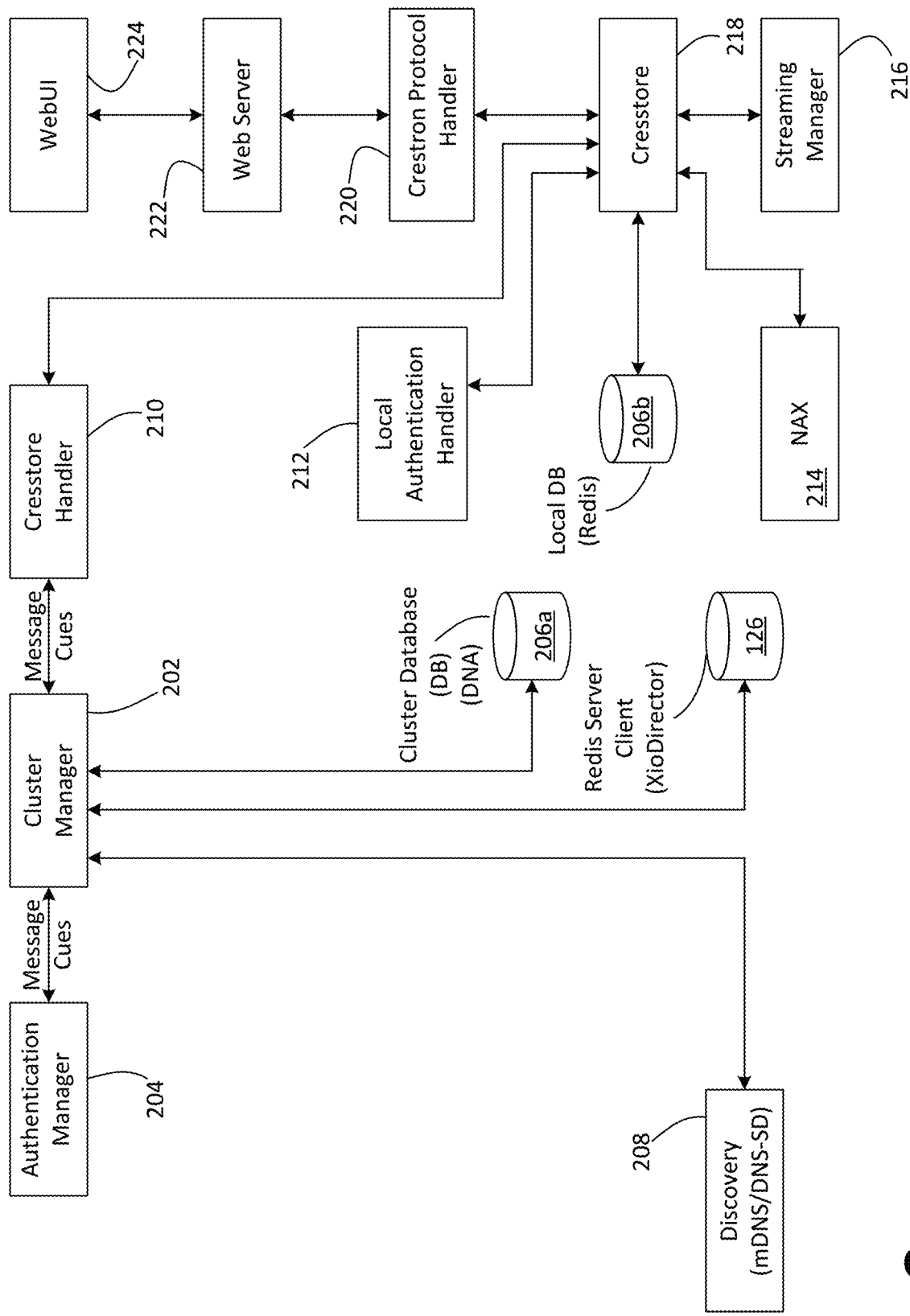
FIG. 2 illustrates a block diagram of software and hardware components that embody the virtual manager software application to configure and control a plurality of electronic audio distribution devices in the audio distribution system shown in FIG. 1 according to aspects of the embodiments.

Attention is directed to FIG. 2, which illustrates a block diagram of software and hardware components that embody VM App 108 to configure and control a plurality of electronic audio distribution devices in ADS 100 shown in FIG. 1 according to aspects of the embodiments.

VM 108 comprises a number of software module, described below, that enable it to interface with users to configure different devices of ADS 100 according to aspects of the embodiments. As those of skill in the art can appreciate, a detailed discussion of the exact nature of operation of the interfaces and intercommunications between all of the software modules is not needed to understand the various aspects of the embodiments, in configuring and controlling ADS 100 via VM App 108 through any one device. Thus, in fulfillment of the dual purposes of clarity and brevity, a detailed discussion of the intercommunications has been omitted from herein; nonetheless, a brief discussion of the different software modules has been included for completeness.

VM App 108 includes Cluster Manager (CM) Software Module (SWM) 202. CM SWM 202 handles configuration and status reporting for all audio devices that are part of ADS 100, and replicates device configurations to all group devices for redundancy.

VM App 108 includes Authentication Manager (AM) SWM 204. AM SWM 204 allows authorized devices to be part of a group.

VM App 108 includes cluster database 206a, which is part of Redis. Redis is an open source software, and is used as an in-memory data structure store, used as a distributed, in-memory key—value database, cache, and message broker, with optional durability. Redis supports different kinds of abstract data structures, such as strings, lists, maps, sets, sorted sets, HyperLogLogs, bitmaps, streams, and spatial indices. Redis is used to store configuration from Virtual Manager, to replicate configuration to all DNA devices and detect failure of any device in the group particularly VM App 108 includes local database (local db) 206b, and is also part of Redis.

VM App 108 includes discovery SWM 208. Discovery SWM 208 facilitates discovery of existing and new audio devices in ADS 100.

VM App 108 includes Cresstore handler SWM 210. Cresstore handler SWM 210 handles all communications between other software module components and Cresstore 218.

VM App 108 includes Cresstore 218. Cresstore allows inter process communication and allows to retrieve and store data in database.

VM App 108 includes local authentication handler SWM 212. Local authentication handler authenticates remote users.

VM App 108 includes NAX SWM 214. NAX is network audio stream handler and setup up AES67 audio streams in the hardware.

VM App 108 includes streaming manager SWM 216. Streaming manager sets up internet streams.

VM App 108 includes Crestron protocol handler 220. Crestron protocol handler routes user request and response to appropriate handler.

VM App 108 includes web server 222. Webserver handles user requests from Web UI.

VM App 108 includes web user interface (Web UI) 224. Web UI is the user interface for settings and display status information.

Also shown in FIG. 2 is Redis server client 126, which is a connectivity to physical server, located elsewhere, and which is used as a device in the network that can act as Virtual Manager.

Figure 3:
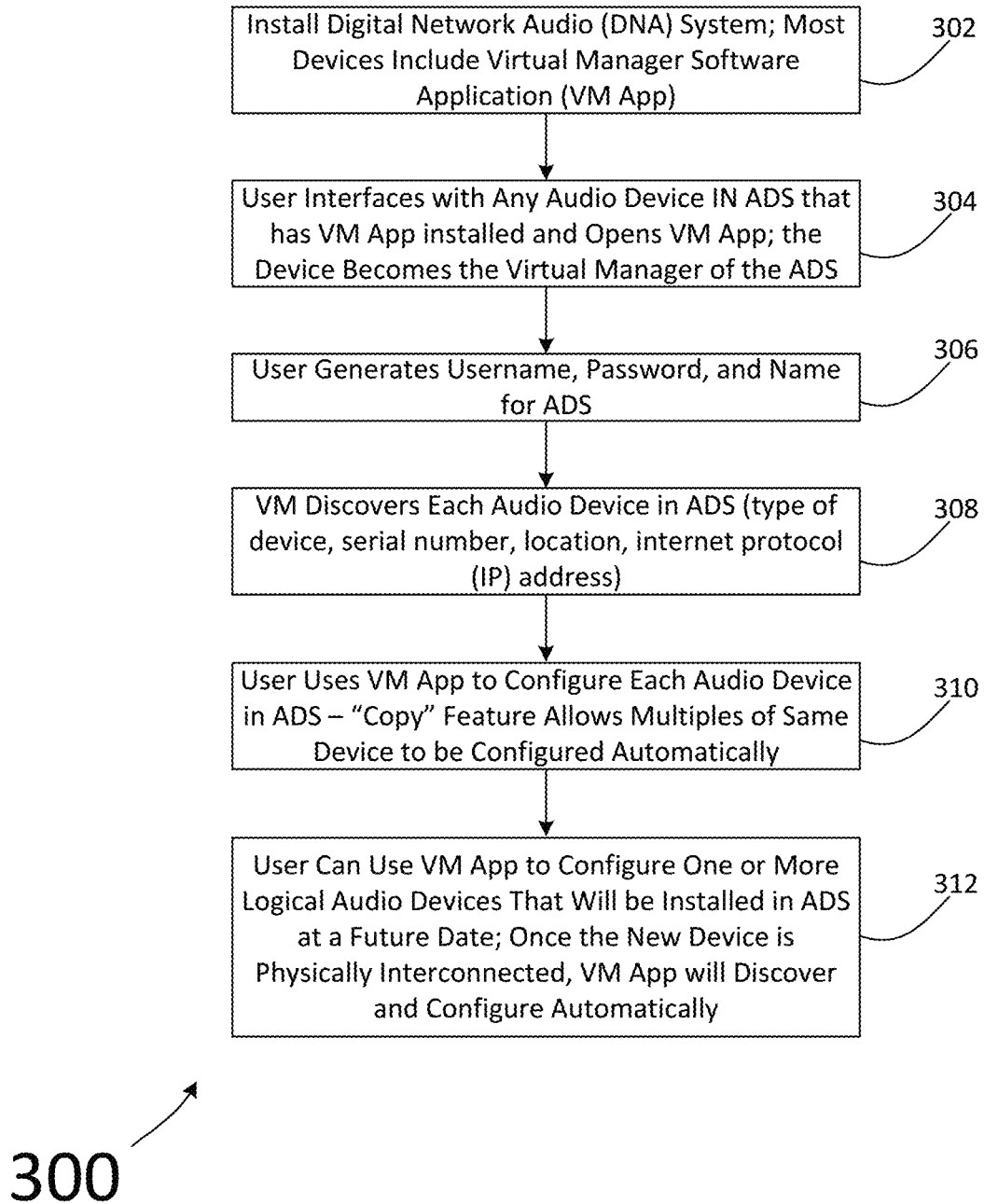
FIG. 3 illustrates a flow chart of a method for using the virtual manager software application to configure and control a plurality of electronic audio distribution devices in the audio distribution system shown in FIG. 1 according to aspects of the embodiments.

FIG. 3 illustrates a flow chart of method 300 for using the virtual manager software application to configure and control a plurality of electronic audio distribution devices in ADS 100 as shown in FIG. 1 according to aspects of the embodiments.

Method 300 begins with method step 302. In method step 302, ADS 100 is installed (ADS 100 can also be referred to as "a digital network audio (DNA) audio distribution system"). Each piece of audio processing equipment (from hereon in, the audio devices of ADS 100 will be referenced generically as a "DNA device"), has a copy of VM App 108 installed in it. Each DNA device can be accessed by a web interface, or via personal computer (PC) 102 and/or mobile electronic device (MED) 104 through wired and/or wireless means.

In method step 304, the user interfaces with any one of the DNA devices, executes VM App 108, and then selects the interfaced device to be the virtual manager for ADS 100.

In method step 306, the user generates a username, password, and name for the ADS network.

In method step 308, VM App 108 discovers the entire ADS network—it determines the physical location, existing configuration, IP address, and present status of each DNA device in ADS 100. VM App 108 uses a "tutela" certificate to verify that each DNA device in ADS 100 is a Crestron device. According to further aspects of the embodiments, however, ADS 100 does not necessarily need to consist of only Crestron devices. According to aspects of the embodiments, VM App 108 can establish zones, or identify previously set up zones. A "zone" is a collection of DNA audio devices that may or may not be physically located to each other, or proximate to each other, but which for the purposes of the user of ADS 100, should be treated as within a zone. A zone can be a room or a portion of a large room, or some other area. According to aspects of the embodiments, one reason for creating a zone, and assigning DNA devices to it, is to have them all be configured in a similar manner, or that they need to be configured in a similar manner. According to aspects of the embodiments, once ADS 100 is "discovered" by VM App 108, and all the components (DNA audio devices) identified and assigned to the named ADS 100, then that ADS 100 can be accessed virtually anywhere in the world by a user using a local copy of VM App 108 through one or more networks including the Internet.

In method step 310, the user can then use VM App 108 to "configure" each DNA audio device. Configuration refers to setting up the audio device to operate in some manner. By way of a non-limiting example, suppose there are 4 DSP's in a very large conference room, and each DSP outputs to 8 amplifiers, and each amplifier outputs to 8 passive loudspeakers. This can be referred to as the "Main Conference Room Zone." Each DSP can be configured substantially similarly to process audio signals that are generally expected to be digital audio signals of a person speaking; therefore, the filtering functions might be set up particularly to a certain bandwidth (e.g., from about 40 Hz to about 4 kHz), and other functions (gating, ducking, and the like).

If there are multiples of the same devices (e.g., as in FIG. 1 there are two DSPs, several amplifiers for each DSP, and so on), VM 108 can be instructed by the user to copy the configuration to each same device. For example, if there are 4 amplifiers connected to DSP1, then it might be useful to have each of those amplifiers to have the same gain settings, but the amplifiers connected to DSP2 could have different gain settings.

In addition to "configuring" physical devices, the user can use the VM to configure "logical" devices (method step 312), or devices that exist in memory only—that is, if it is anticipated that a set of new amplifiers will be installed in the future, the user can use VM App 108 to create them in VM App 108, and store their configurations. If the IP addresses are known before hand, and stored with the configuration, then when installed and discovered by VM App 108, VM App 108 can substantially automatically transfer the previously established configuration to each new DNA audio device as it is installed.

Although not displayed in any of the drawing Figures, graphical user interfaces (GUIs) that can be part of a webpage can be useful in implementing various aspects of the embodiments. A GUI is a human-computer interface (i.e., a way for humans to interact with computers) in the form of windows, icons, and menus that can be manipulated by pointer 116 associated with use of a mouse (and often to a limited extent by a keyboard as well).

GUIs stand in sharp contrast to command line interfaces (CLIs), which use only text and are accessed solely by a keyboard. The most familiar example of a CLI to many people isMS-DOS, or some modes of Linux.

Windows are contained portions of a monitor screen that can display its contents (e.g., a program, icons, a text file, or an image) seemingly independently of the rest of a display screen. Note that icons can be a GUI. A significant feature of GUIs is the ability for multiple windows to be open simultaneously. Each window can display a different application/program, or each can display different files (e.g., text, image(s), or other types of files/documents) that have been opened or created with a single application. A menu of a window is another example of a GUI.

An icon is a small picture or symbol in a GUI that represents a program (or command), a file, a directory, or a device (such as a hard disk or floppy). Icons are used both on desktop and within application programs. Those of skill in the art are familiar with the term "desktop," which represents a monitor screen when either no other programs are open, or open programs have been minimized or less than full screen. A non-limiting, non-exhaustive set of icons can include small rectangles to represent files, file folders (to represent directories), a trash can (to indicate a place to dispose of unwanted files and directories) and buttons on web browsers (for navigating to previous pages, for reloading the current page.

Commands are issued in a GUI by using a mouse, trackball, or touchpad to first move a pointer on a screen to, or on top of, an icon, menu item, or window of interest in order to select that object. Then, for example, icons and windows can be moved by dragging (moving the mouse with the held down) and objects or programs can be opened by clicking on their icons. In addition, GUIs can include fields for entering data, and buttons for saving the entered data.

As those of skill in the art can appreciate, there are several advantages to the use of GUIs. One substantive advantage of the use of GUIs is that they make computer operation more intuitive, and thus easier to learn and use. For example, it is much easier for a new user to move a file from one directory to another by dragging its icon with the mouse than by having to remember and type seemingly arcane commands to accomplish the same task.

Adding to this intuitiveness of operation is the fact that GUIs generally provide users with immediate, visual feedback about the effect of each action. For example, when a user deletes an icon representing a file, the icon immediately disappears, confirming that the file has been deleted (or at least sent to a trash can). This contrasts with the situation for a CLI, in which the user types a delete command (inclusive of the name of the file to be deleted) but receives no automatic feedback indicating that the file has actually been removed.

In addition, GUIs allow users to take full advantage of the powerful multitasking (the ability for multiple programs and/or multiple instances of single programs to run simultaneously) capabilities of modern operating systems by allowing such multiple programs and/or instances to be displayed simultaneously. The result is a large increase in the flexibility of computer use and a consequent rise in user productivity.

However, as those of the skill in the art can further appreciate, GUIs have become much more than a mere convenience. GUIs have also become the standard in human-computer interaction, and it has influenced the work of a generation of computer users. Moreover, it has led to the development of new types of applications and entire new industries. An example is desktop publishing, which has revolutionized (and partly wiped out) the traditional printing and typesetting industry.

Despite the great convenience of GUIs however, system administrators and other advanced users tend to prefer the CLI for many operations because it is frequently more convenient and generally more powerful. On Unix-like operating systems for example, GUIs are actually just attractive, convenient coverings for command line programs (i.e., programs which operate from a CLI), and they rely on them for their operation.

One of the great attractions of Unix-like operating systems is that they have maintained their CLI capabilities while continuing to improve their GUIs, thereby allowing advanced users to harness the full power of the computer while simultaneously making it easier for beginning and intermediate users. In contrast, the newer versions of Microsoft Windows (such as 2000 and XP) have downgraded their CLIs to a marginal role, at best.

Figure 4:
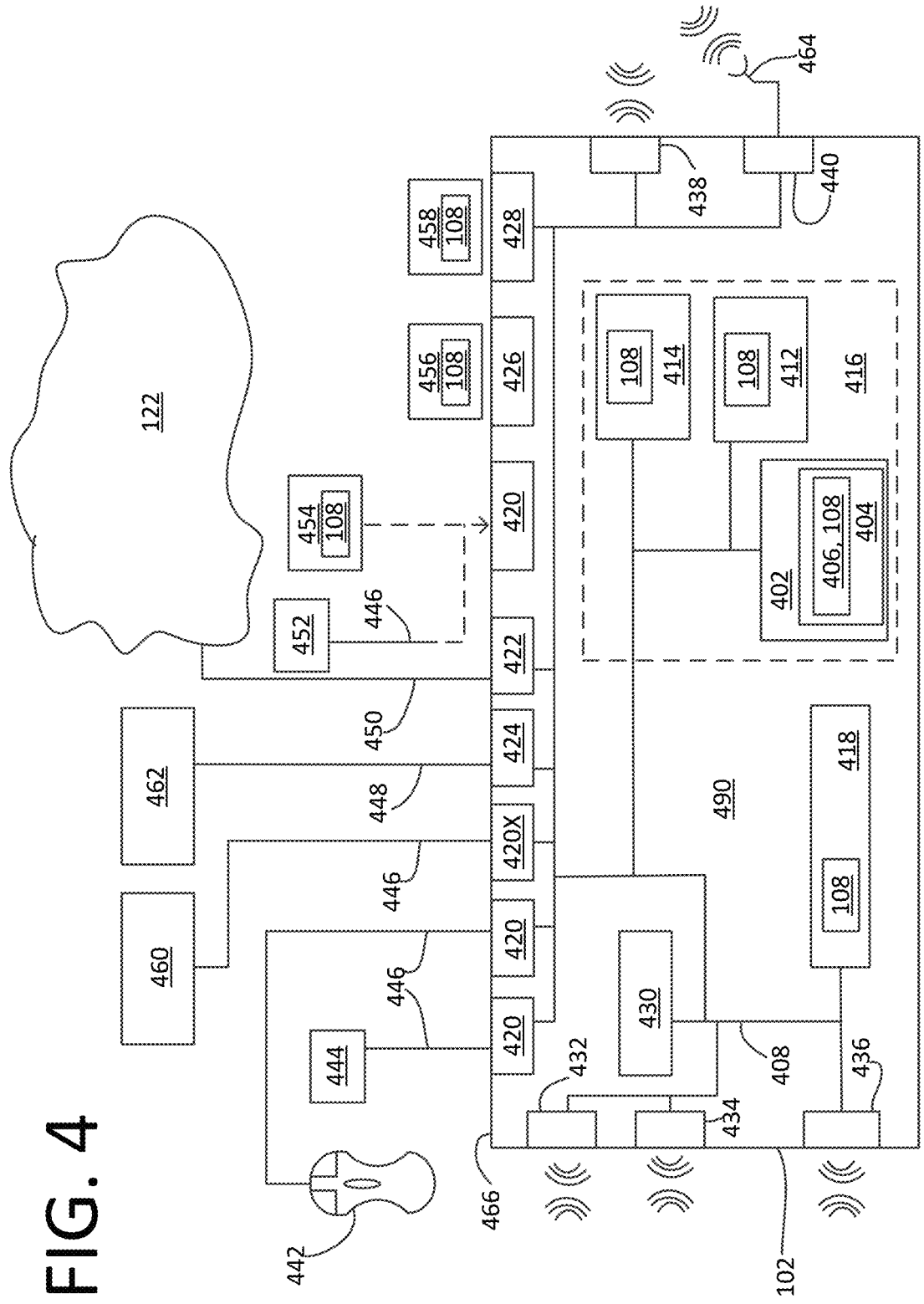
FIG. 4 illustrates a block diagram of the major components of a personal computer (PC), server, laptop, personal electronic device (PED), personal digital assistant (PDA), tablet (e.g., iPad), or any other computer (herein after, "server") suitable for use to implement the method shown in FIG. 3, among others, for configuring an audio distribution system according to aspects of the embodiments.

FIG. 4 illustrates a block diagram of the major components of a personal computer (PC), server, laptop, personal electronic device (PED), personal digital assistant (PDA), tablet (e.g., iPad), or any other processing device 102 (herein after, "server 102") suitable for use to implement method 300 among others, for configuring an audio distribution system, according to aspects of the embodiments. Server 102 comprises, among other items, a shell/box 466, integrated display/touch-screen 430 (though not used in every application of the computer), internal data/command bus (bus) 408, printed circuit board (PCB) 416, and one or more processors 402, with processor internal memory 404 (which can be typically read only memory (ROM) and/or random access memory (RAM)). Those of ordinary skill in the art can appreciate that in modern computer systems, parallel processing is becoming increasingly prevalent, and whereas a single processor would have been used in the past to implement many or at least several functions, it is more common currently to have a single dedicated processor for certain functions (e.g., digital signal processors) and therefore could be several processors, acting in serial and/or parallel, as required by the specific application. Server 102 further comprises multiple input/output ports, such as universal serial bus (USB) ports 420, Ethernet ports 422, and video graphics array (VGA) ports/high definition multimedia interface (HDMI) ports 424, among other types. Further, server 102 includes externally accessible drives such as compact disk (CD)/digital versatile disk (DVD) read/write (RW) (CD/DVD/RW) drive 426, and floppy diskette drive 428 (though less used currently, some computers still include this type of interface). Server 102 still further includes wireless communication apparatus, such as one or more of the following: Wi-Fi transceiver 432, BlueTooth (BT) transceiver 434, near field communications (NFC) transceiver 436, third generation (3G)/fourth Generation (4G)/long term evolution (LTE)/fifth generation (5G) transceiver (cellular transceiver) 438, communications satellite/global positioning system (satellite) transceiver 440, and antenna 464.

Internal memory that is located on PCB 416 itself can comprise hard disk drive (HDD) 418 (these can include conventional magnetic storage media, but, as is becoming increasingly more prevalent, can include flash drive memory 454, among other types), ROM 412 (these can include electrically erasable programmable ROM (EEPROMs), ultra-violet erasable PROMs (UVPROMs), among other types), and RAM 414. Usable USB port 420 is flash drive memory 454, and usable with CD/DVD/RW drive 426 are CD/DVD diskettes (CD/DVD) 456 (which can be both read and write-able). Usable with floppy diskette drive 428 are floppy diskettes 458. External memory storage device 452 can be used to store data and programs external to server 102, and can itself comprise another hard disk drive 418, flash drive memory 454, among other types of memory storage. External memory storage device 452 is connectable to server 102 via USB cable 446. Each of the memory storage devices, or the memory storage media (1406, 418, 412, 414, 452, 454, 456, and 458, among others), can contain parts or components, or in its entirety, executable software programming code or application that has been termed App 108 according to aspects of the embodiments, which can implement part or all of the portions of method 300 among other methods not shown, described herein.

In addition to the above described components, server 102 also comprises keyboard 460, external display 462, printer/scanner/fax machine 444, and mouse 442 (although not technically part of the server 102, the peripheral components as shown in FIGS. 4 (452, 462, 460, 442, 454, 456, 458, 446, 450, 444, and 448) are adapted for use with server 102 that for purposes of this discussion they shall be considered as being part of the server 102). Other cable types that can be used with server 102 include RS 232, among others, not shown, that can be used for one or more of the connections between server 102 and the peripheral components described herein. Keyboard 460, and mouse 442 are connectable to server 102 via USB cable 446, and external display 462 is connectible to server 102 via VGA cable/HDMI cable 448. Server 102 is connectible to network 122 via Ethernet port 422 and Ethernet cable 450 via a router and modulator-demodulator (MODEM) and internet service provider, none of which are shown in FIG. 4. All of the immediately aforementioned components (424, 452, 462, 460, 442, 454, 456, 458, 446, 450, and 444) are known to those of ordinary skill in the art, and this description includes all known and future variants of these types of devices.

External display 462 can be any type of currently available display or presentation screen, such as liquid crystal displays (LCDs), light emitting diode displays (LEDs), plasma displays, cathode ray tubes (CRTs), among others (including touch screen displays). In addition to the user interface mechanism such as mouse 442, server 102 can further include a microphone, touch pad, joystick, touch screen, voice-recognition system, among other inter-active inter-communicative devices/programs, which can be used to enter data and voice, and which all of are currently available and thus a detailed discussion thereof has been omitted in fulfillment of the dual purposes of clarity and brevity.

As mentioned above, server 102 further comprises a plurality of wireless transceiver devices, such as Wi-Fi transceiver 432, BT transceiver 434, NFC transceiver 436, cellular transceiver 438, satellite transceiver 440, and antenna 464. While each of Wi-Fi transceiver 432, BT transceiver 434, NFC transceiver 436, cellular transceiver 438, and satellite transceiver 440 has their own specialized functions, each can also be used for other types of communications, such as accessing a cellular service provider (not shown), accessing network 122 (which can include the Internet), texting, emailing, among other types of communications and data/voice transfers/exchanges, as known to those of skill in the art. Each of Wi-Fi transceiver 432, BT transceiver 434, NFC transceiver 436, cellular transceiver 438, satellite transceiver 440 includes a transmitting and receiving device, and a specialized antenna, although in some instances, one antenna can be shared by one or more of Wi-Fi transceiver 432, BT transceiver 434, NFC transceiver 436, cellular transceiver 438, and satellite transceiver 440. Alternatively, one or more of Wi-Fi transceiver 432, BT transceiver 434, NFC transceiver 436, cellular transceiver 438, and satellite transceiver 440 will have a specialized antenna, such as satellite transceiver 440 to which is electrically connected at least one antenna 464.

In addition, server 102 can access network 122 (of which the Internet can be part of, as shown and described in FIG. 5 below), either through a hard wired connection such as Ethernet port 422 as described above, or wirelessly via Wi-Fi transceiver 432, cellular transceiver 438 and/or satellite transceiver 440 (and their respective antennas) according to aspects of the embodiments. Server 102 can also be part of a larger network configuration as in a global area network (GAN) (e.g., internet), which ultimately allows connection to various landlines.

According to further aspects of the embodiments, integrated touch screen display 430, keyboard 460, mouse 442, and external display 462 (if in the form of a touch screen), can provide a means for a user to enter commands, data, digital, and analog information into the server 102. Integrated and external displays 430, 462 can be used to show visual representations of acquired data, and the status of applications that can be running, among other things.

Bus 408 provides a data/command pathway for items such as: the transfer and storage of data/commands between processor 402, Wi-Fi transceiver 432, BT transceiver 434, NFC transceiver 436, cellular transceiver 438, satellite transceiver 440, integrated display 430, USB port 420, Ethernet port 422, VGA/HDMI port 424, CD/DVD/RW drive 426, floppy diskette drive 428, and processor internal memory 404. Through bus 408, data can be accessed that is stored in internal memory 404. Processor 402 can send information for visual display to either or both of integrated and external displays 430, 462, and the user can send commands to the computer operating system (operating system (OS)) 406 that can reside in processor internal memory 404 of processor 402, or any of the other memory devices (456, 458, 418, 412, and 414).

Server 102, and either internal memories 404, 412, 414, and 418, or external memories 452, 454, 456 and 458, can be used to store computer code that when executed, implements method 300, as well as other methods not shown and discussed, for configuring an audio distribution system, according to aspects of the embodiments. Hardware, firmware, software, or a combination thereof can be used to perform the various steps and operations described herein. According to aspects of the embodiments, App 108 for carrying out the above discussed steps can be stored and distributed on multi-media storage devices such as devices 418, 412, 414, 454, 456 and/or 458 (described above) or other form of media capable of portably storing information. Storage media 454, 456 and/or 458 can be inserted into, and read by devices such as USB port 420, CD/DVD/RW drive 426, and floppy disk drive 428, respectively.

As also will be appreciated by one skilled in the art, the various functional aspects of the aspects of the embodiments can be embodied in a wireless communication device, a telecommunication network, or as a method or in a computer program product. Accordingly, aspects of embodiments can take the form of an entirely hardware embodiment or an embodiment combining hardware and software aspects. Further, the aspects of embodiments can take the form of a computer program product stored on a computer-readable storage medium having computer-readable instructions embodied in the medium. Any suitable computer-readable medium can be utilized, including hard disks, CD-ROMs, DVDs, optical storage devices, or magnetic storage devices such as a floppy disk or magnetic tape. Other non-limiting examples of computer-readable media include flash-type memories or other known types of memories.

Further, those of ordinary skill in the art in the field of the aspects of the embodiments can appreciate that such functionality can be designed into various types of circuitry, including, but not limited to field programmable gate array structures (FPGAs), application specific integrated circuitry (ASICs), microprocessor based systems, among other types. A detailed discussion of the various types of physical circuit implementations does not substantively aid in an understanding of the aspects of the embodiments, and as such has been omitted for the dual purposes of brevity and clarity. However, the systems and methods discussed herein can be implemented as discussed and can further include programmable devices.

Such programmable devices and/or other types of circuitry as previously discussed can include a processing unit, a system memory, and a system bus that couples various system components including the system memory to the processing unit. The system bus can be any of several types of bus structures including a memory bus or memory controller, a peripheral bus, and a local bus using any of a variety of bus architectures. Furthermore, various types of computer readable media can be used to store programmable instructions. Computer readable media can be any available media that can be accessed by the processing unit. By way of example, and not limitation, computer readable media can comprise computer storage media and communication media. Computer storage media includes volatile and nonvolatile as well as removable and non-removable media implemented in any method or technology for storage of information such as computer readable instructions, data structures, program modules or other data. Computer storage media includes, but is not limited to, RAM, ROM, EEPROM, flash memory or other memory technology, CD-ROMs, DVDs or other optical disk storage, magnetic cassettes, magnetic tape, magnetic disk storage or other magnetic storage devices, or any other medium which can be used to store the desired information, and which can be accessed by the processing unit. Communication media can embody computer readable instructions, data structures, program modules or other data in a modulated data signal such as a carrier wave or other transport mechanism and can include any suitable information delivery media.

The system memory can include computer storage media in the form of volatile and/or nonvolatile memory such as ROM and/or RAM. A basic input/output system (BIOS), containing the basic routines that help to transfer information between elements connected to and between the processor, such as during start-up, can be stored in memory. The memory can also contain data and/or program modules that are immediately accessible to and/or presently being operated on by the processing unit. By way of non-limiting example, the memory can also include an operating system, application programs, other program modules, and program data.

The processor can also include other removable/non-removable and volatile/nonvolatile computer storage media. For example, the processor can access a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the operating environment include, but are not limited to, magnetic tape cassettes, flash memory cards, digital versatile disks, digital video tape, solid state RAM, solid state ROM and the like.

A hard disk drive can be connected to the system bus through a non-removable memory interface such as an interface, and a magnetic disk drive or optical disk drive can be connected to the system bus by a removable memory interface, such as an interface.

Aspects of the embodiments discussed herein can also be embodied as computer-readable codes on a computer-readable medium. The computer-readable medium can include a computer-readable recording medium and a computer-readable transmission medium. The computer-readable recording medium is any data storage device that can store data which can be thereafter read by a computer system. Examples of the computer-readable recording medium include ROM, RAM, CD-ROMs and generally optical data storage devices, magnetic tapes, flash drives, and floppy disks. The computer-readable recording medium can also be distributed over network coupled computer systems so that the computer-readable code is stored and executed in a distributed fashion. The computer-readable transmission medium can transmit carrier waves or signals (e.g., wired, or wireless data transmission through the Internet). Also, functional programs, codes, and code segments to, when implemented in suitable electronic hardware, accomplish or support exercising certain elements of the appended claims can be readily construed by programmers skilled in the art to which the aspects of the embodiments pertains.

The disclosed aspects of the embodiments provide a system and method for configuring an audio distribution system, according to aspects of the embodiments, on one or more servers 102. It should be understood that this description is not intended to limit aspects of the embodiments. On the contrary, aspects of the embodiments are intended to cover alternatives, modifications, and equivalents, which are included in the spirit and scope of the aspects of the embodiments as defined by the appended claims. Further, in the detailed description of the aspects of the embodiments, numerous specific details are set forth to provide a comprehensive understanding of the claimed aspects of the embodiments. However, one skilled in the art would understand that various aspects of the embodiments can be practiced without such specific details.

Figure 5:
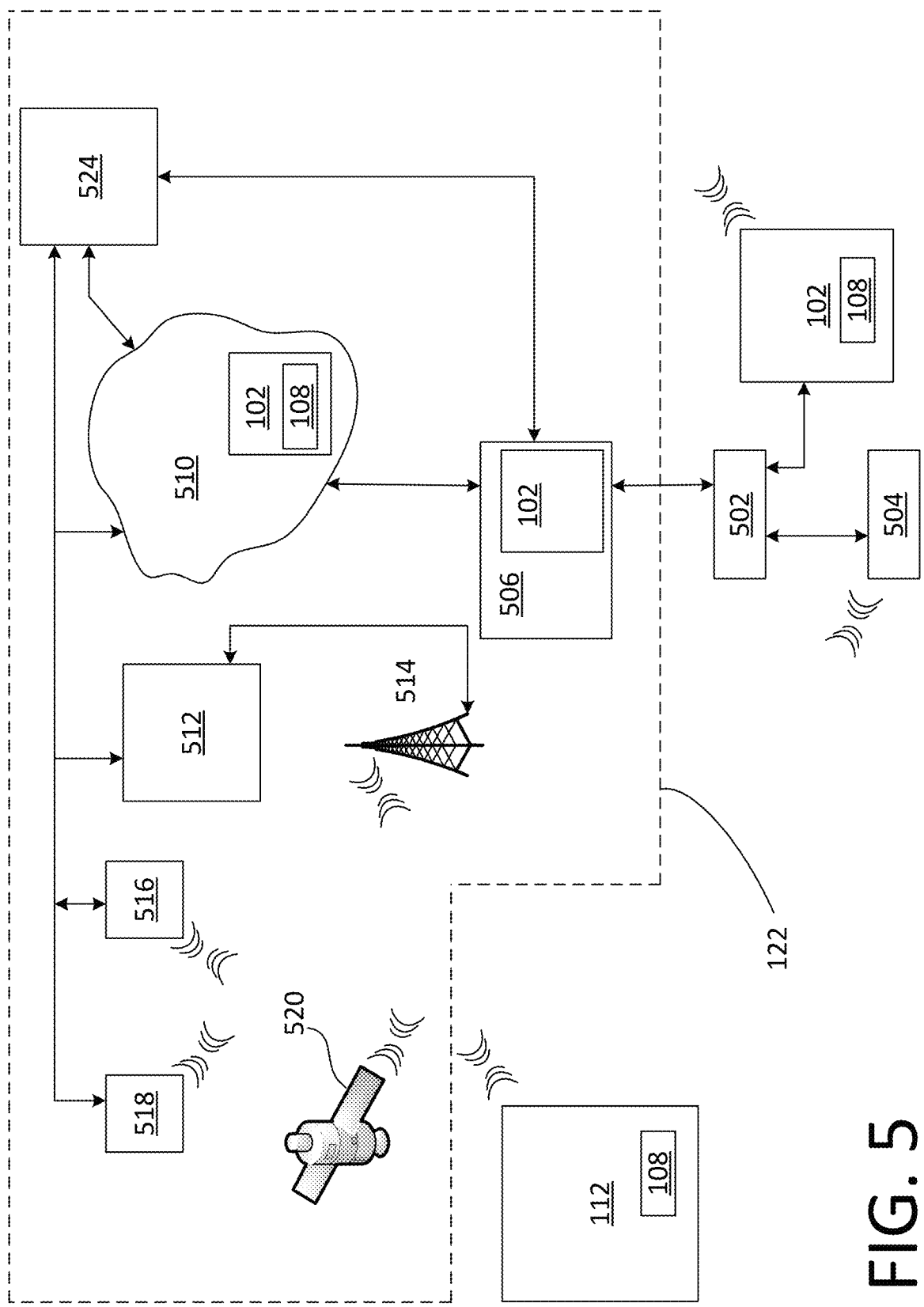
FIG. 5 illustrates network system within which the system and method for configuring an audio distribution system can be implemented, according to aspects of the embodiments.

FIG. 5 illustrates network system 122 within which the system and method for configuring an audio distribution system can be implemented, according to aspects of the embodiments. Much of the infrastructure of network system 122 shown in FIG. 5 is or should be known to those of skill in the art, so, in fulfillment of the dual purposes of clarity and brevity, a detailed discussion thereof shall be omitted.

According to aspects of the embodiments, a user of the above described system and method can store App 108 on their server 102 as well as mobile electronic device (MED)/personal electronic device (PED) 522 (hereon in referred to as "MED 112). MED 112 can include, but are not limited to, so-called smart phones, tablets, personal digital assistants (PDAs), notebook and laptop computers, and essentially any device that can access the internet and/or cellular phone service or can facilitate transfer of the same type of data in either a wired or wireless manner.

MED 112 can access cellular service provider 512, either through a wireless connection (cellular tower 514) or via a wireless/wired interconnection (a "Wi-Fi" system that comprises, e.g., modulator/demodulator (modem) 502, wireless router 504, internet service provider (ISP) 506, and internet 510 (although not shown, those of skill in the art can appreciate that internet 510 comprises various different types of communications cables, servers/routers/switches 508, and the like, wherein data/software/applications of all types is stored in memory within or attached to servers or other processor based electronic devices, including, for example, App 108 within a computer/server that can be accessed by a user of App 108 on their MED 112 and/or server 102). As those of skill in the art can further appreciate, internet 510 can include access to "cloud" computing service(s) and devices, wherein the cloud refers to the on-demand availability of computer system resources, especially data storage and computing power, without direct active management by the user. Large clouds often have functions distributed over multiple locations, each location being a data center.

Further, MED 112 can include NFC, "Wi-Fi," and Bluetooth (BT) communications capabilities as well, all of which are known to those of skill in the art. To that end, network system 122 further includes, as many homes (and businesses) do, one or more servers 102 that can be connected to wireless router 504 via a wired connection (e.g., modem 502) or via a wireless connection (e.g., Bluetooth). Modem 502 can be connected to ISP 506 to provide internet-based communications in the appropriate format to end users (e.g., server 102), and which takes signals from the end users and forwards them to ISP 506.

MEDs 112 can also access global positioning system (GPS) satellite 520, which is controlled by GPS station 518, to obtain positioning information (which can be useful for different aspects of the embodiments), or MED 112 can obtain positioning information via cellular service provider 512 using cellular tower(s) 514 according to one or more methods of position determination. Some MEDs 112 can also access communication satellites 520 and their respective satellite communication systems control stations 516 (satellite 520 in FIG. 5 is shown common to both communications and GPS functions) for near-universal communications capabilities, albeit at a much higher cost than convention "terrestrial" cellular services. MED 112 can also obtain positioning information when near or internal to a building (or arena/stadium) through the use of one or more of NFC/BT devices. FIG. 5 also illustrates other components of network 122 such as plain old telephone service (POTS) provider 524.

According to further aspects of the embodiments, and as described above, network 122 also contains other types of servers/devices that can include server 102, wherein one or more processors, using currently available technology, such as memory, data and instruction buses, and other electronic devices, can store and implement code that can implement the system and method for configuring an audio distribution system, according to aspects of the embodiments.

According to further aspects of the embodiments, additional features and functions of inventive embodiments are described herein below, wherein such descriptions are to be viewed in light of the above noted detailed embodiments as understood by those skilled in the art.

According to further aspects of the embodiments, additional features and functions of inventive embodiments are described herein below, wherein such descriptions are to be viewed in light of the above noted detailed embodiments as understood by those skilled in the art.

As described above, an encoding process is discussed specifically in reference to FIG. 3, although such delineation is not meant to be, and should not be taken in a limiting manner, as additional methods according to aspects of the embodiments have been described herein. The encoding processes as described are not meant to limit the aspects of the embodiments, or to suggest that the aspects of the embodiments should be implemented following the encoding processes. The purpose of the encoding processes as described is to facilitate the understanding of one or more aspects of the embodiments and to provide the reader with one or many possible implementations of the processed discussed herein. FIG. 3 illustrates a flowchart of various steps performed during the encoding process, but such encoding processes are not limited thereto. The steps of FIG. 3 are not intended to completely describe the encoding processes but only to illustrate some of the aspects discussed above.

This application may contain material that is subject to copyright, mask work, and/or other intellectual property protection. The respective owners of such intellectual property have no objection to the facsimile reproduction of the disclosure by anyone as it appears in published Patent Office file/records, but otherwise reserve all rights.

It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for an audio system to allow one of several similar devices to be a master device within which audio system variables for all the devices can be set up and distributed.

Alternate Embodiments

Alternate embodiments may be devised without departing from the spirit or the scope of the different aspects of the embodiments.

What is claimed is:

1. An audio distribution system comprising:
   a Redis server, the Redis server adapted to store Redis data to be used in configuring the audio distribution system;
   a plurality of audio devices, the plurality of audio devices and Redis server interconnected to form the audio distribution system, wherein each of the plurality of audio devices comprises—
   at least one processor;
   an electronic communications interface operatively connected to the at least one processor and adapted to receive data from a user and transfer the data to the at least one processor; and
   a memory operatively connected with the at least one processor, wherein the memory stores computer-executable instructions that, when executed by the at least one processor, causes the at least one processor in a first audio device to execute a method for configuring the audio distribution system that comprises:
      establishing communications using the electronic communications interface between the user and the at least one processor of the first audio device, such that data input by the user is received by the at least one processor of the first audio device;
      establishing communications to each of the remaining plurality of audio devices and Redis server in the audio distribution system;
      obtaining information from each of the remaining plurality of audio devices with which communications have been established, such information including one or more of an audio device name, part number, serial number, internet protocol address number, and physical location;
      receiving configuration information from the user that pertains to a specific audio device of the plurality of audio devices in the audio distribution system that, when installed on a specific audio device, causes the specific audio device to operate in a known manner; and
      copying that configuration information to others of the same specific type of audio device in the audio distribution system.

2. The system according to claim 1, wherein the method further comprises:
   receiving configuration information from the user that pertains to each of the remaining specific audio devices of the plurality of audio devices in the audio distribution system that, when installed on the specific audio device, causes that specific audio device to operate in a known manner; and
   copying the configuration file for the specific audio device to others of the same specific type of audio device in the audio distribution system.

3. The system according to claim 2, wherein the method further comprises:
   receiving configuration information from the user that pertains to one or more audio devices not presently interconnected to the audio distribution system and storing the currently unused configuration information;
   connecting the previously un-interconnected one or more audio devices to the audio distribution system;
   substantially automatically finding the now interconnected but previously un-interconnected audio devices and establishing communications therewith;

obtaining information from each of the now interconnected but previously un-interconnected audio devices, such information including one or more of an audio device name, part number, serial number, internet protocol address number, and physical location;

copying the currently unused configuration information to each of the now interconnected but previously un-interconnected audio devices, wherein audio devices that are of the same type receive the same configuration information.

4. The system according to claim 3, wherein the method further comprises:

assigning the first audio device to be a virtual manager of the audio distribution system, wherein the virtual manager is adapted to perform all of the steps of the method for configuring the audio distribution system, and is further adapted to communicate from one or more users through one or more networks.

5. The system according to claim 4, wherein the one or more networks includes a local area network.

6. The system according to claim 4, wherein the one or more networks includes a Crestron audio network.

7. The system according to claim 4, wherein the one or more networks includes an internet.

8. A method for configurating an audio distribution system, comprising:

establishing communications using an electronic communications interface between a user and at least one processor located in a first audio device of a plurality of audio devices, wherein the plurality of audio devices and a Redis server are interconnected to form the audio distribution system, and wherein the Redis server is adapted to store Redis data to be used in configuring the audio distribution system, and wherein each of the plurality of audio devices comprises— at least one processor;

the electronic communications interface operatively connected to the at least one processor and adapted to receive data from a user and transfer the data to the at least one processor; and a memory operatively connected with the at least one processor, wherein the memory stores computer-executable instructions that, when executed by the at least one processor, allows the at least one processor in a first audio device to execute the method for configuring the audio distribution system;

establishing communications using the electronic communications interface between the user and the at least one processor of the first audio device, such that data input by the user is received by the at least one processor of the first audio device;

establishing communications to each of the remaining plurality of audio devices and Redis server in the audio distribution system;

obtaining information from each of the remaining plurality of audio devices with which communications have been established, such information including one or more of an audio device name, part number, serial number, internet protocol address number, and physical location;

receiving configuration information from the user that pertains to a specific audio device of the plurality of audio devices in the audio distribution system that, when installed on a specific audio device, causes the specific audio device to operate in a known manner; and copying that configuration information to others of the same specific type of audio device in the audio distribution system.

9. The method according to claim 8, further comprising:

receiving configuration information from the user that pertains to each of the remaining specific audio devices of the plurality of audio devices in the audio distribution system that, when installed on the specific audio device, causes that specific audio device to operate in a known manner; and copying the configuration file for the specific audio device to others of the same specific type of audio device in the audio distribution system.

10. The method according to claim 9, further comprising:

receiving configuration information from the user that pertains to one or more audio devices not presently interconnected to the audio distribution system and storing the currently unused configuration information;

connecting the previously un-interconnected one or more audio devices to the audio distribution system;

substantially automatically finding the now interconnected but previously un-interconnected audio devices and establishing communications therewith;

obtaining information from each of the now interconnected but previously un-interconnected audio devices, such information including one or more of an audio device name, part number, serial number, internet protocol address number, and physical location;

copying the currently unused configuration information to each of the now interconnected but previously un-interconnected audio devices, wherein audio devices that are of the same type receive the same configuration information.

11. The method according to claim 10, further comprising:

assigning the first audio device to be a virtual manager of the audio distribution system, wherein the virtual manager is adapted to perform all of the steps of the method for configuring the audio distribution system, and is further adapted to communicate from one or more users through one or more networks.

12. The system according to claim 11, wherein the one or more networks includes a local area network.

13. The system according to claim 11, wherein the one or more networks includes a Crestron audio network.

14. The system according to claim 11, wherein the one or more networks includes an internet.

* * * * *